United States Patent [19]
Ito

[11] Patent Number: 5,278,552
[45] Date of Patent: Jan. 11, 1994

[54] INDICATOR CONTROL CIRCUIT

[75] Inventor: Akio Ito, Konosu, Japan

[73] Assignee: Jeco Company Limited, Japan

[21] Appl. No.: 942,103

[22] Filed: Sep. 8, 1992

Related U.S. Application Data

[63] Continuation of Ser. No. 601,418, Oct. 22, 1990, abandoned.

[30] Foreign Application Priority Data

Oct. 23, 1989 [JP] Japan .................. 1-275604

[51] Int. Cl.⁵ .............................................. G03C 19/16
[52] U.S. Cl. ........................ 340/870.21; 340/870.05; 364/724.17
[58] Field of Search ............ 340/870.21, 870.05, 340/789, 791; 364/724.1, 724.13, 724.17, 745; 377/19, 20, 44, 55

[56] References Cited

U.S. PATENT DOCUMENTS

| | | | |
|---|---|---|---|
| 3,735,387 | 5/1973 | Miller | 340/791 |
| 3,939,413 | 2/1976 | Milkovic | 324/142 |
| 4,509,044 | 4/1985 | Yachida | 377/19 |
| 4,521,867 | 6/1985 | Kasuga | 364/724.17 |
| 4,796,217 | 1/1989 | Takahashi | 364/745 |
| 5,014,232 | 5/1991 | Andre | 364/724.17 |

FOREIGN PATENT DOCUMENTS 3325616  3/1984  Fed. Rep. of Germany.

OTHER PUBLICATIONS

Papoulis, Athanasios, ISBN 0-03-056097-7, S. 219, 1980.
Azizi, Seyed Ali, ISBN 3-486-24561-9, S. 184, 185, 200, 201, 1981.

Primary Examiner—Donald J. Yusko
Assistant Examiner—Michael Horabik
Attorney, Agent, or Firm—Andrus, Sceales, Starke & Sawall

[57] ABSTRACT

An indicator control circuit includes a signal conversion circuit for converting an analog signal corresponding to a predetermined physical quantity into first digital data and a digital filter circuit for generating second digital data from the first digital data in accordance with a predetermined filter characteristic. An intermediate digital data is obtained during a process in which the second digital data is generated from the first digital data. The digital filter circuit includes operating circuit for operating the intermediate digital data so that a relationship between the first digital data and the second digital data has a hysteresis. The second digital data generated by the digital filter circuit is used for indicating the predetermined physical quantity on an indicator.

12 Claims, 6 Drawing Sheets

INDICATOR CONTROL CIRCUIT

The present application is a continuation application of U.S. Pat. Application 07/601,418, filed Oct. 22, 1990, and now abandoned.

BACKGROUND OF THE INVENTION

The present invention relates to an indicator control circuit that converts a measurement value of a physical quantity into digital data in order to perform display on an indicator such as a speed meter, a tachometer, a water temperature gauge and a fuel gauge, and that performs display on instruments in accordance with that digital data, and in particular, relates to an indicator control circuit that generates a hysteresis in a digital filter without the use of a hysteresis circuit.

A digital display indicator differs from analog display indicator in that the display of the speed of an automobile is given in digital values, for example.

One problem with an indicator that performs digital display is that even when an automobile is running at a constant speed, the value displayed is scattered around the value that is the indicated speed. On the other hand, it is necessary to have the prompt renewal of the displayed speed in accordance with changes in the speed when the vehicle is accelerating and decelerating but there is a poor following. One means of eliminating these problems is to provide a hysteresis circuit. However, although such hysteresis circuits enable the scattering of the display value of the instrument to be reduced, they have an overall configuration which is complex and also have a high cost.

FIG. 1 is a block diagram of one example of a conventional indicator control circuit. A signal conversion circuit 21 is configured from a waveform rectifier circuit 12 and a frequency count circuit 13, and the input signals to be measured which are input from an input terminal 10 are converted into digital data, and the converted digital data is supplied to a digital filter circuit 14 so that the response characteristics can be adjusted, and then drive signals corresponding to digital data are generated in the drive circuit 19 and supplied to the display device 20 and drive the gauge of the display device 20.

A digital filter circuit 14 can be configured most simply by a primary filter but they can also be configured from secondary and later filters. FIG. 2 indicates an example of a digital filter circuit 14 that has a complex filter configuration. This digital filter circuit 14 is configured from multipliers 34 to 44, adders 45 to 52, and a delay circuits 53 to 55.

As can be seen from this configuration, in a conventional indicator control circuit, there is no circuit to prevent the flickering of the display value on the instrument when there is a constant speed. Accordingly, there is the problem of flickering of the display value on the display indicator when a hysteresis circuit is not provided.

FIG. 3 indicates a display indicator that is provided with a hysteresis circuit. The flickering of the display value is reduced by a hysteresis circuit 23. The hysteresis circuit 23 is set so that the value displayed for the speed is renewed only when the difference between a speed displayed on a display portion 25 and a speed corresponding a count value in a vehicle speed counter 27 is greater than a predetermined value.

In addition, an indicator control circuit, shown in FIG. 3, also has zero display judgment circuit 29. The zero judgment circuit 29 outputs 0km/h data when the speed is less than a predetermined value, and then the 0km/h is displayed on the display portion.

SUMMARY OF THE INVENTION

Accordingly, a general object of the present invention is to provide a new and novel indicator control circuit in which the above-mentioned problems are eliminated.

A specific objective of the present invention is to provide a display indicator control circuit that can reduce the scattering of the display value that occurs in the display indicator, and that without being provided with a hysteresis circuit of the type described above, can perform the smooth display of a measured value corresponding to the sensation of the user, and in accordance with a value that is the objective measured value.

The objectives can be attained by an indicator control circuit comprising signal conversion means for converting an analog signal corresponding to a predetermined physical quantity into first digital data, and digital filter means, coupled to the signal conversion means, for generating second digital data from the first digital data in accordance with a predetermined filter characteristic, intermediate digital data being obtained during a process in which the second digital data is generated from the first digital data, wherein the digital filter means comprises operating means for operating the intermediate digital data so that a relationship between the first digital data and the second digital data has a hysteresis, and the second digital data generated by the digital filter means is used for indicating the predetermined physical quantity on an indicator.

Additional objects, features and advantages of the present invention will become apparent from the following detailed description when read in conjunction with the accompanying drawings.

DESCRIPTION OF THE PREFERRED EMBODIMENTS

A description will now be given of an embodiment of the present invention. This embodiment is an example of an indicator control circuit controlling an indicator which indicates a revolution number of an engine of an automobile.

Figure 1:
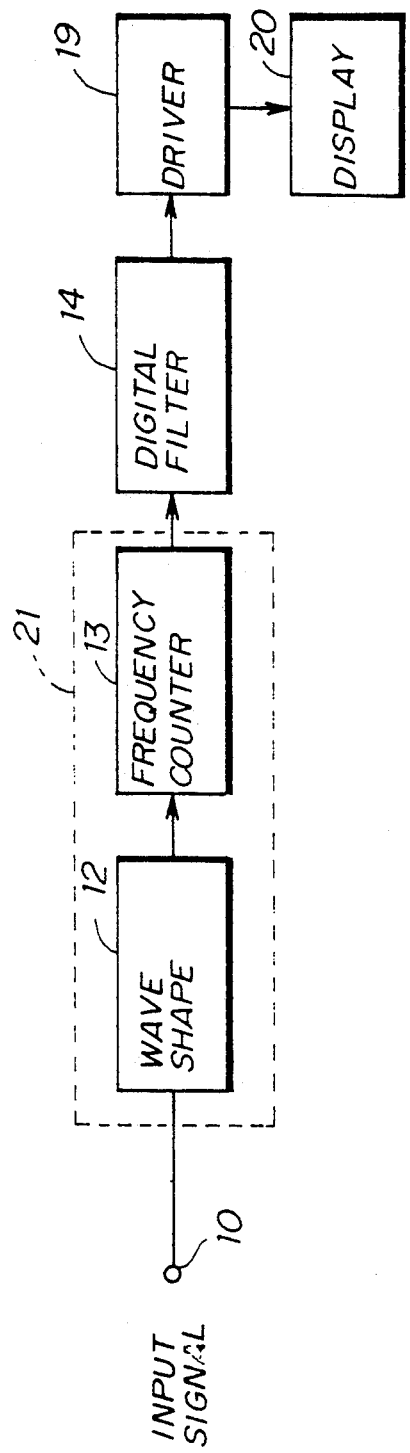
FIG. 1 is a block diagram of one example of the indicator control circuit of the prior art.

This indicator control circuit has a basic structure which is substantially identical to a structure of the conventional indicator control circuit as shown in FIG. 1. That is, the indicator control circuit has the signal conversion circuit 21, the digital filter 14 and the driver circuit 19 for driving the display device 20 (the indicator).

Figure 4:
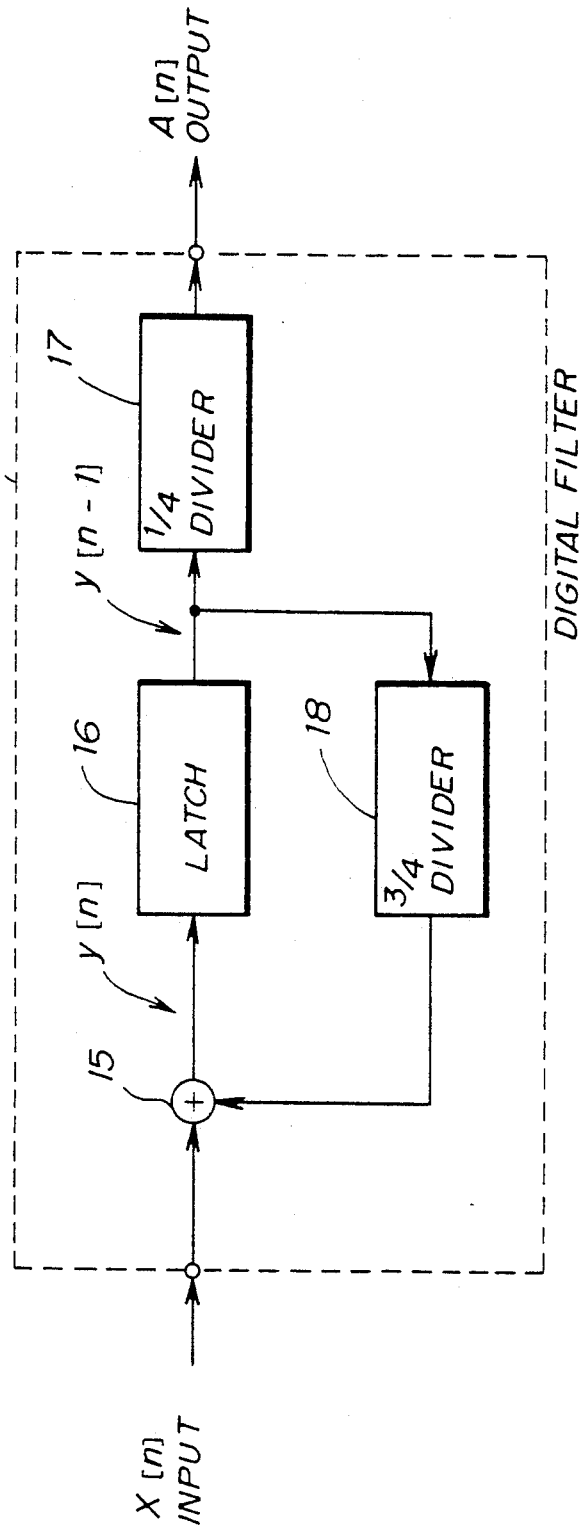
FIG. 4 is a block diagram of the major portions of a first embodiment of the present invention.

FIG. 4 is a block diagram of the digital filter 14 according to the embodiment of the present invention. A digital filter circuit 14 shown in FIG. 4 has an adder 15, a latch circuit 16, a ¼ divider circuit 17 and a ¾ divider circuit. The ¼ divider circuit 17 makes the data into one quarter, and the ¾ divider circuit 18 makes the data into three quarters. That is, the ¼ divider circuit 17 multiplies data output from the latch circuit 16 by 1/4 , and the ¾ divider circuit 18 multiplies the data output from the latch circuit 16 by ¾.

A fraction in the calculation result output by the ¼ divider circuit 17 is omitted. That is, a predetermined lower bits which represents the fraction of output data from the ¼ divider circuit 17 are omitted. A fraction equal to or greater than 2/4 in a calculation result in the ¾ divider circuit 18 is counted as a unit, and the fractions lower than 2/4 are omitted. That is, a bit of the output data which is one bit higher than the highest-order bit of the predetermined lower bits representing the fraction is incremented by 1 when the fraction is equal to or greater than than 2/4, and the predetermined lower bits of output data from the ¾ divider circuit 18 are omitted when the fraction is lower than 2/4.

The adder 15 is supplied with digital data from the ¾ divider circuit 18 and the digital data X(n) from the frequency count circuit 13, and X(n) and the calculation results of the ¾ divider circuit 18 are added. The digital data Y(n) output by the adder 15 is delayed by the latch circuit 16. The digital data Y(n−1) output from the latch circuit 16 is supplied to the ¼ divider circuit 17. The digital data Y(n-1) is multiplied by ¼ and the ¼ divider circuit 17 outputs Y(n−1)/4 as A(n). The digital data Y(n-1) is supplied to the ¾ divider circuit 18 and multiplied by ¾. The data Y(n-1)x¾ output from the divider circuit 18 is supplied to the adder 15.

The digital data A(n) output from the digital filter circuit 14 is supplied to the drive circuit 19. The drive circuit 19 supplies the display device 20 with the digital data A(n) output from the digital filter circuit 14. When this is done, the drive circuit 19 uses the digital data A(n) to generate drive signals in order to perform display corresponding to the input signals. The display device 20 then performs display corresponding to the input signals, by the drive signals from the drive circuit 19.

A further description will be given of the digital filter circuit 14.

The output data from the frequency counter 13 is supplied to the digital filter circuit 14, as the input data X(n). The input data X(n) is supplied to the adder 15 and then the adder 15 outputs a digital data Y(n). The digital data Y(n) is input to the latch circuit 16, and the latch circuit 16 operates in synchronism with a predetermined clock signal so that the latch circuit delays the digital data Y(n) and outputs data Y(n−1). The ¾ divider circuit 18 multiplies the digital data Y(n−1) by ¾ so that the output data Y(n) from the adder 15 is represented by the following formula;

$$Y(n) = X(n) + Y(n-1) \times \tfrac{3}{4}.$$

Furthermore, the ¼ divider circuit 17 multiplies the digital data Y(n−1) output from the latch circuit 16 by ¼ so that the output data A(n) from the ¼ divider circuit 17 represents the following formula;

$$A(n) = Y(n-1) \times \tfrac{1}{4}$$

In the ¾ divider circuit 18, the fraction not lower than 2/4 in the data which is represented by Y(n−1)×¾ is counted as a unit, and the fraction lower than 2/4 in the data which is represented by Y(n−1)×¾ is omitted. In the ¼ divider circuit 17, all the fractions in the data which is represented by Y(n−1)×¼ are omitted. The fractions in the calculation results in the ¼ divider circuit 17 and the ¾ divider circuit 18 are respectively operated as has been described above, in the digital filter 14, so that a relationship between the digital data X(n) supplied to the digital filter circuit 14 and the digital data A(n) output from the digital filter circuit 14 has a hysteresis.

For example, when the input data X(n) indicated in Table 1 drops from 20 to 10 for n=0 to n=1, the output data A(n) converges on 10 for the final count number n=13. On the other hand, as indicated in Table 2 for when the input data X(n) changes from 0 to 10 for n=0 to n=1, the output data A(n) converges on 9 for the final count number n=13.

TABLE 1

| | (Example of decreasing values) | | | |
|---|---|---|---|---|
| n | X(n) | Y(n) | Y(n−1) | A(n) |
| — | 20 | 80 | 80 | 20 |
| 1 | 10 | 70 | 80 | 20 |
| 2 | 10 | 63 | 70 | 17 |
| 3 | 10 | 57 | 63 | 15 |
| 4 | 10 | 53 | 57 | 14 |
| 5 | 10 | 50 | 53 | 13 |
| 6 | 10 | 48 | 50 | 12 |
| 7 | 10 | 46 | 48 | 12 |
| 8 | 10 | 45 | 46 | 11 |
| 9 | 10 | 44 | 45 | 11 |
| 10 | 10 | 43 | 44 | 11 |
| 11 | 10 | 42 | 43 | 10 |
| 12 | 10 | 42 | 42 | 10 |
| 13 | 10 | 42 | 42 | 10 |

TABLE 2

| | (Example of increasing values) | | | |
|---|---|---|---|---|
| n | X(n) | Y(n) | Y(n−1) | A(n) |
| — | 0 | 0 | 0 | 0 |
| 1 | 10 | 10 | 0 | 0 |
| 2 | 10 | 18 | 10 | 2 |
| 3 | 10 | 24 | 18 | 4 |
| 4 | 10 | 28 | 24 | 6 |
| 5 | 10 | 31 | 28 | 7 |
| 6 | 10 | 33 | 31 | 7 |
| 7 | 10 | 35 | 33 | 8 |
| 8 | 10 | 36 | 35 | 8 |
| 9 | 10 | 37 | 36 | 9 |
| 10 | 10 | 38 | 37 | 9 |
| 11 | 10 | 39 | 38 | 9 |
| 12 | 10 | 39 | 39 | 9 |
| 13 | 10 | 39 | 39 | 9 |

Referring to Table 1 and Table 2, a converged value of the output data A(n) in a case where the input data X(n) decreases and changes to a constant value as shown in Table 1 differs from a converged value of the output data in a case where the input data X(n) increases and changes to the same constant value as shown in Table 2. That is, a hysteresis occurs in the relationship between the input data X(n) and the output data A(n).

A description will now be given of a first detailed example of the digital filter circuit 14 with reference to FIG. 5.

Figure 5:
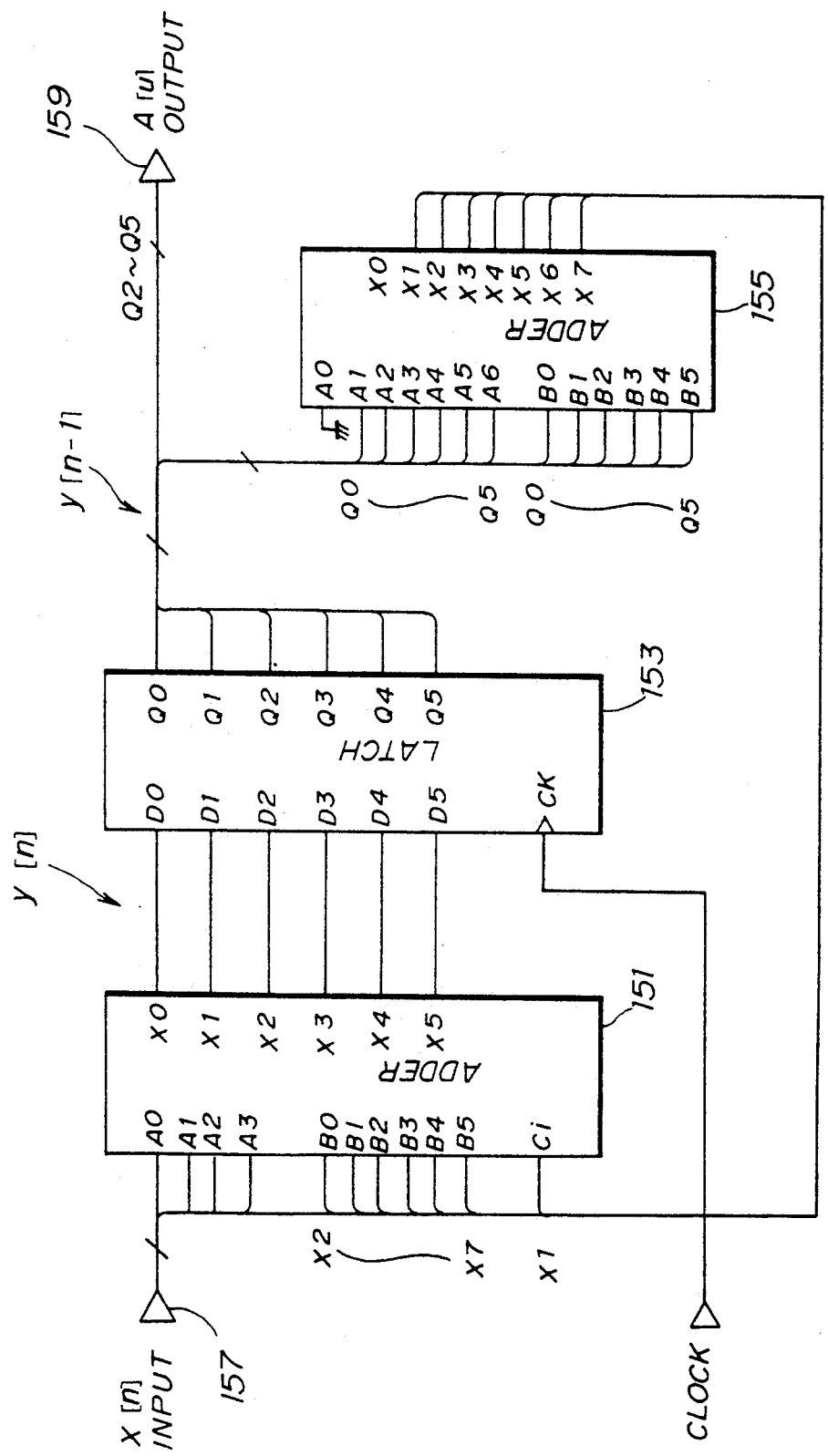
FIG. 5 is a circuit diagram of a digital filter circuit of a first embodiment of the present invention.

Referring to FIG. 5, the digital filter circuit 14 has an adder circuit 151, a latch circuit 153 and an adder circuit 155. The adder circuit 151 has 4 bits input terminals $A_0$ through $A_3$, 6 bits input terminals $B_0$ through $B_5$ and a carry bit terminal Ci. The digital data X(n) is supplied to via an input terminal 157 to the 4 bits input terminals $A_0$ through $A_3$. An output data from the adder circuit 151 is supplied to the latch circuit 153. The latch circuit is made of a flip-flop. The latch circuit 153 latches the data Y(n) output from the adder circuit 151 in synchronism with a predetermined clock signal so that he latch circuit 153 outputs a delayed data Y(n−1). The adder circuit 155 has 7 bits input terminals $A_0$ through $A_6$ and 6 bits input terminals $B_0$ through $B_5$. The output data $Q_0$ through $Q_5$ from the latch circuit 153, which represents the data Y(n−1), is shifted by one bit and the shifted data is supplied to upper six bits $A_1$ through $A_6$ out of the 7 bits input terminals of the adder circuit 155. The output data $Q_0$ through $Q_5$ from the latch circuit 153 is also supplied to the 6 bits input terminal $B_0$ through $B_5$ of the adder circuit 155. The lowest bit $A_0$ of the 7 bit terminals of the adder circuit 155 is connected to the ground. Therefor, the adder circuit 155 operates in accordance with the following formula;

$$Y(n-1)+Y(n-1)\times 2=Y(n-1)\times 3$$

An output data $X_0$ through $X_7$ from the adder circuit 155 is shifted by two bits, and the shifted data $X_2$ through $X_7$ is supplied to the 6 bits input terminals $B_0$ through $B_5$ of the adder circuit 151. Thus, the data $Y(n-1)\times \frac{3}{4}$ is supplied to the 6 bit terminals $B_0$ through $B_5$ of the adder circuit 151. In this case, the lower 2 bits $X_0$ and $X_1$ of the output data from the adder circuit 155 represent a fraction in the data $Y(n-1)\times \frac{3}{4}$. The bit $X_1$ is supplied to the carry bit terminal Ci of the adder circuit 151. That is, when the bit $X_1$ is "1", the carry bit in the adder circuit 151 is "1", and when the bit $X_1$ is "0", the carry bit in the adder circuit 151 is "0". Therefor, the adder circuit 151 outputs the data Y(n) which is represented by the following formula;

$$Y(n)=X(n)+(Y(n-1)\times \tfrac{3}{4})+\text{carry}$$

The carry corresponds to the fraction (represented by 2 bits $X_0$ and $X_1$) in the data $Y(n-1)\times \frac{3}{4}$ and is either "1" or "0".

The data Y(n) represented by the above formula is input to the latch circuit 153, and then the latch circuit 153 outputs 6 bits data $Q_0$ through $Q_5$ representing the data Y(n−1). The 6 bits data $Q_0$ through $Q_5$ is shifted by two bits, and then the shifted data $Q_2$ through $Q_5$ is supplied to an output terminal 159. Therefor, the data A(n) supplied to the output terminal 159 is represented by the following formula;

$$A(n)=Y(n-1)/4$$

The data A(n), as the output data from the digital filter circuit 14, is supplied to the driver circuit 19.

Figure 6:
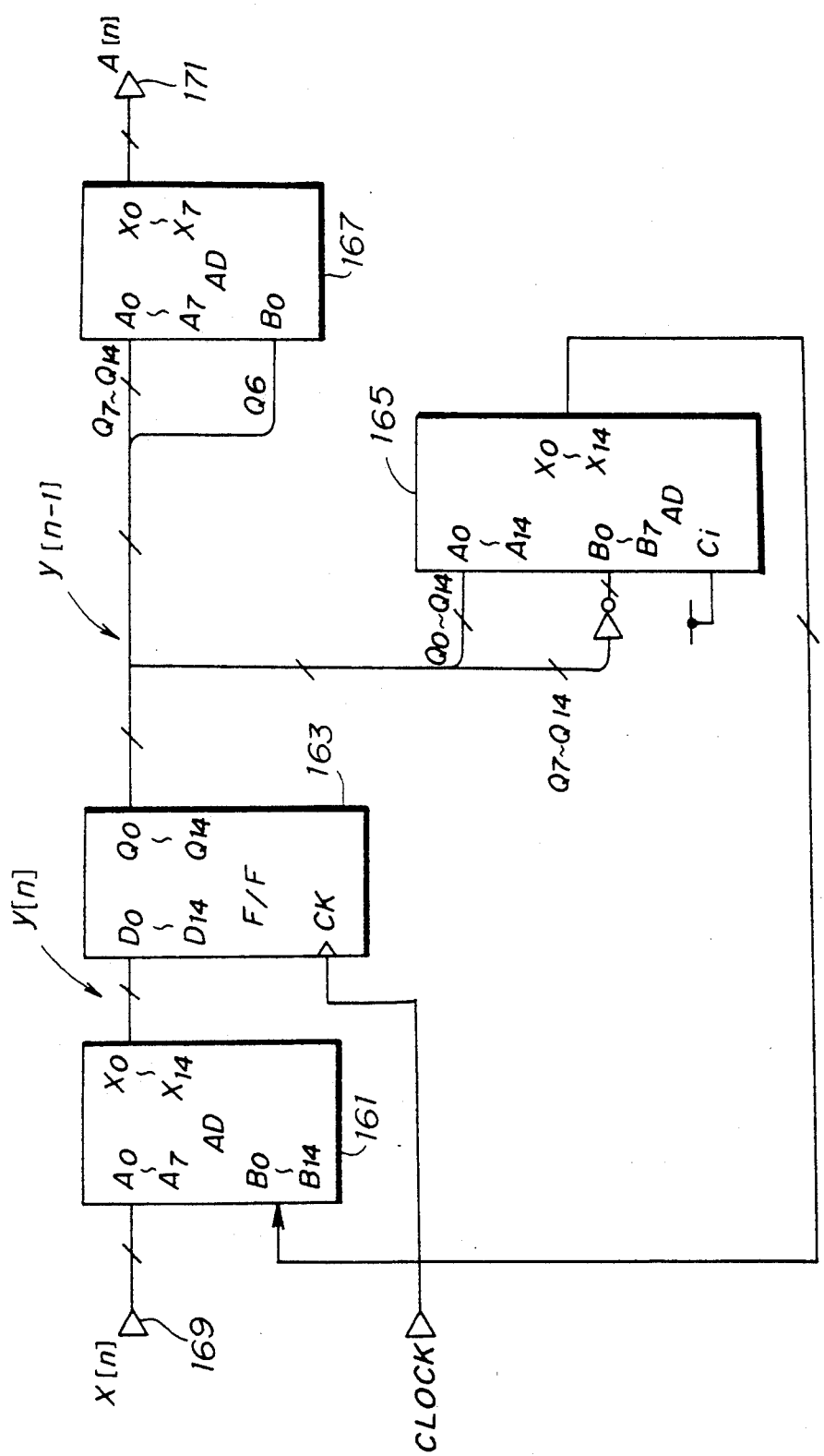
FIG. 6 is a circuit diagram of a digital filter circuit of a second embodiment of the present invention.

The following is a description of a second embodiment shown in FIG. 6. In the present invention, the operation circuits are not limited to $\frac{1}{4}$ divider circuit 17 and $\frac{3}{4}$ divider circuits 18.

The input data X(n) which is 8 bits data is input of an input terminal 169. The input data X(n) is then supplied to input terminals $A_0$ through $A_7$ of the adder circuit 161. An output data Y(n) from the adder circuit 161 is input to the flip-flop 163 which latches the data Y(n) in synchronism with a predetermined clock signal. The flip-flop 163 outputs a delayed data Y(n−1) which is 15 bits data ($Q_0$ through $Q_{14}$) An adder 165 has an A-input port ($A_0$ through $A_{14}$), a B-input port ($B_0$ through $B_7$) and a carry bit terminal Ci. The output data Y(n−1) from the flip-flop 163 is supplied to the A-input port of the adder 165. The data Y(n−1) is shifted by 7 bits, and the shifted data $Q_7$ through $Q_{14}$ are supplied via inverters to the B-input port of the adder circuit 165. A high voltage is supplied to the carry bit terminal Ci of the adder circuit 165. Therefor, the adder circuit 165 outputs the following data;

$$Y(n-1)-[Y(n-1)128]-1+1.$$

The output data $X_0$ through $X_{14}$ from the adder circuit 165 is supplied to terminals $B_0$ though $B_{14}$ of the adder circuit 161. Thus, the adder circuit 61 outputs the data Y(n) represented by the following formula;

$$Y(n)=X(n)+Y(n-1)\times 127/128$$

The output data Y(n−1) ($Q_0$ through $Q_{14}$) from the flip-flop 163 is shifted by 7 bits. That is, the shifted data $Q_7$ through $Q_{14}$ represents Y(n−1)/128. In this case, the lower 7 bits of the output data $Q_0$ through $Q_{14}$ from the flip-flop 163 represents a fractional odd in the data Y(n−1)/128.

Then, the shifted data and the most significant bit $Q_6$ of the lower 7 bits of the output data from the flip-flop 163 are added by a adder circuit 167. The adder circuit 167 outputs the data A(n) represented by the following formula;

$$A(n)=Y(n-1)/128.$$

In this calculation, the fractional odd not less than $\frac{1}{2}$ is counted as a unit, and the fractional odd less than $\frac{1}{2}$ is omitted.

The output data A(n) is supplied via an output terminal 171 to the driver circuit 19.

In these embodiments, the coefficients used for the calculation are respectively, $\frac{1}{4}$ and $\frac{3}{4}$, and 1/128 and 127/128. The coefficients used for the calculation in the digital filter circuit 14 are not limited to the above values. It is possible to substitute $\frac{1}{2^n}$ for $\frac{1}{4}$ or 1/128, and to substitute $(2^n-1)/2^n$ for $\frac{3}{4}$ or 127/128, where n is a natural number.

In the digital filter circuit described above, it is possible to give a hysteresis in the relationship between the input data X(n) and the output data Y(n) without the use of a hysteresis circuit. And then, the display of the display device 20 has a good following characteristic and reduced flickering.

Figure 2:
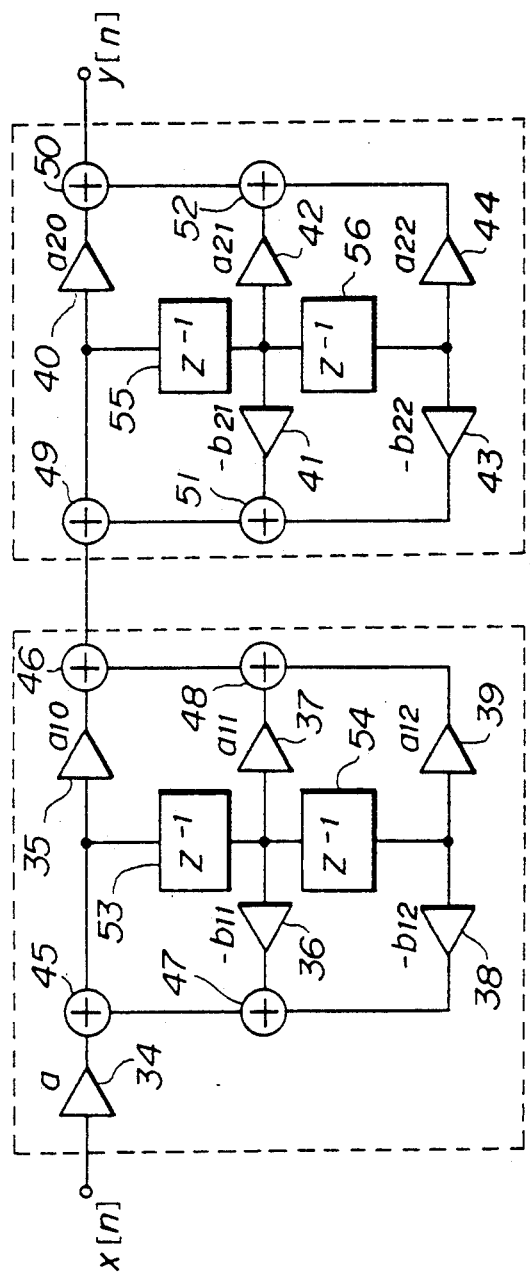
FIG. 2 is a diagram indicating one example of a digital filter circuit configuration having a plural number of filters.
Figure 3:
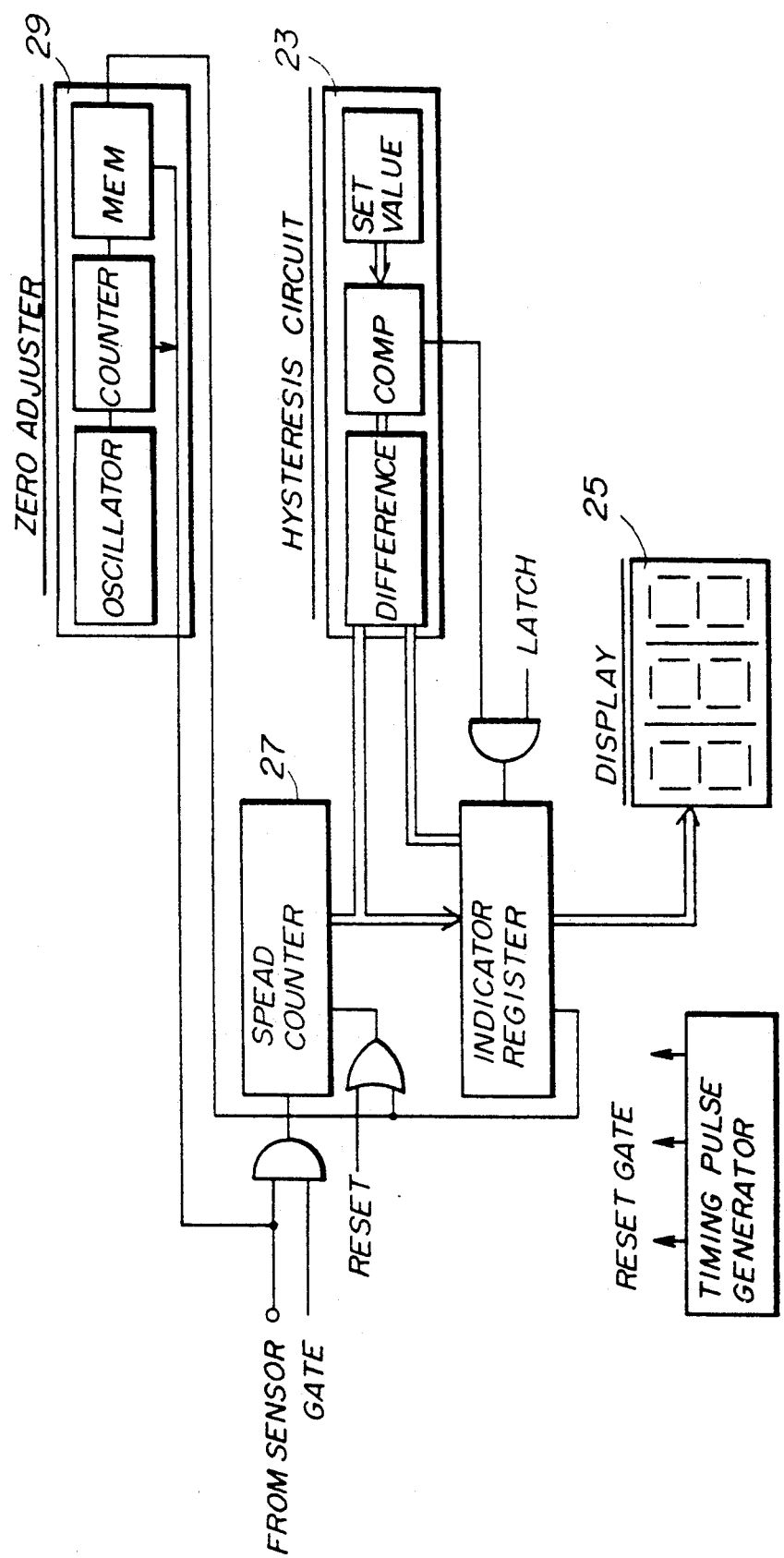
FIG. 3 is a block diagram of a indicator control circuit with a hysteresis circuit.

In addition, if it is taken as a premise that rounding up and truncation processing is to be performed, then the digital filter circuit 14 can use a complex high-stage filter such as that indicated in FIG. 2. Accordingly, the present invention uses a simple circuit configuration to add a hysteresis characteristic without the provision of a special circuit, and therefore obtain a good following characteristic for a digital indicator, and thereby at little cost, reduce the flickering of the displayed values.

Furthermore, there is also a configuration for the digital filter circuit 14 in which a logic circuit is used, or in which a program using a microcomputer is used.

Still furthermore, the fractional odds processing of the calculation results are not limited to the embodiment described above, and end number processing to obtain a hysteresis characteristic can be performed.

Figure 7:
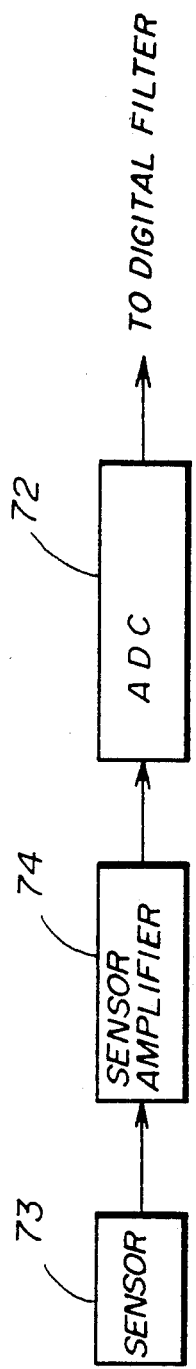
FIG. 7 is a block diagram of the major portions of a third embodiment of the present invention.

The following is a description of a third embodiment. In the embodiment described above, the signal conversion circuit 21 is configured from a waveform rectifier circuit 12 and a frequency count circuit 13, in a configuration that performs the display of speed of rotation and the vehicle speed. However, a method for the detection of pressure, temperature or some quantity other than speed of rotation or vehicle speed is possible through the use of a configuration indicated in FIG. 7 where a sensor 73 and a sensor amplifier 74 and an A/D converter 72 are used. The A/D converter 72 of FIG. 7 uses a signal conversion means 21, and converts the signals obtained from the sensor 73 and the sensor amplifier 74 into digital data X(n) in order to detect the temperature or pressure. The digital data X(n) is supplied to a digital filter circuit so that it is possible to have the display of the temperature and the pressure without any flickering of the values.

The present invention is not limited to the embodiments described above, as various modifications and improvements are still possible within the range of the present invention.

What is claimed is:

1. An indicator control circuit for an indicator which displays a measurement value of a physical quantity, said indicator control circuit comprising:

signal conversion means for converting an analog signal corresponding to a predetermined physical quantity into first digital data; and digital filter means, coupled to said signal conversion means, for generating second digital data from the first digital data in accordance with predetermined filter characteristics;

wherein said digital filter means comprises;

adder means for adding the first digital data supplied from said signal conversion means to feedback data, and for outputting addition data;

delay means coupled to said adder means, for delaying the addition data from said adder means by a predetermined time and for outputting delayed data;

first calculating means, coupled to said delay means, for multiplying the delayed data outputted from said delay means by a first coefficient defined as $(2^n-1)2^n$ where n is a natural number, said first calculating means having first remainder control means for controlling a value of a predetermined remainder of data obtained by multiplying the delayed data by said first coefficient on the basis of the predetermined remainder, and for outputting first calculation data, said first calculation data being supplied, as the feedback data, to said adder means;

second calculating means, coupled to said delay means, for multiplying the delayed data outputted from said delay means by a second coefficient defined as $\frac{1}{2}^n$ where n is a natural number, said second calculating means having second remainder control means for controlling a value of a predetermined remainder of data obtained by multiplying the delayed data by said second coefficient on the basis of the predetermined remainder, and for outputting second calculation data as said second digital data, so that a relationship between said first digital data and said second digital data has a hysteresis in which a converged value of said second digital data, in a case where said first digital data decreases to a constant value, differs from a converged value of said second digital data, in a case where said first digital data increases to the constant value, the hysteresis occurring as a result of a difference between the converged values of said first and second digital data, and so that a hysteresis occurs in the relationship between said first digital data and said second digital data due to the operation of said first remainder control means and said second remainder control means; and wherein said second digital data generated by said digital filter means is used for indicating the predetermined physical quantity on said indicator.

2. An indicator control circuit as claimed in claim 1, wherein said first remainder control means has a first operation means for performing a first remainder operation in which the predetermined remainder is counted as a unit when the value of the predetermined remainder is equal to or greater than a predetermined value and the predetermined remainder is omitted when the value of the predetermined remainder is less than the predetermined value.

3. An indicator control circuit as claimed in claim 1, wherein said first remainder control means has a second operation means for performing a second remainder operation in which the predetermined remainder is omitted when the remainder is an arbitrary value.

4. An indicator control circuit as claimed in claim 1, wherein said second remainder control means has a third operation means for performing a third remainder operation in which the predetermined remainder is counted as a unit when the value of the predetermined remainder is equal to or greater than a predetermined value and the predetermined remainder is omitted when the value of the predetermined remainder is less than the predetermined value.

5. An indicator control circuit as claimed in claim 1, wherein said second remainder control means has a fourth operation means for performing a fourth remainder operation in which the predetermined remainder is omitted when the remainder is an arbitrary value.

6. An indicator control means as claimed in claim 1, wherein said delay means has a latch circuit which latches the addition data output from said adder means in synchronism with a predetermined clock signal.

7. An indicator control circuit as claimed in claim 1, wherein said first calculating means has first bit shift means for shifting the delayed data output from said delay means by a predetermined number bits so that said first calculation means multiplies the delayed data by $(2^n-1)/2^n$.

8. AN indicator control circuit as claimed in claim 1, wherein said second calculating means has a second bit shift means for shifting the delayed data output from said delay means by a predetermined number of bits so that said second calculation means multiplies the delayed data by $\frac{1}{2}^n$.

9. An indicator control circuit as claimed in claim 1 wherein n is equal to 2 so that the first coefficient is $\frac{1}{4}$ and the second coefficient is $\frac{3}{4}$.

10. An indicator control circuit as claimed in claim 1, wherein n is equal to 7 so that the first coefficient is 1/128 and the second coefficient is 127/128.

11. An indicator control circuit as claimed in claim 9, wherein both said first digital data and said second digital data are 4 bits data.

12. An indicator control circuit as claimed in claim 10, wherein both said first digital data and said second digital data are 8 bits data.

* * * * *

UNITED STATES PATENT AND TRADEMARK OFFICE
CERTIFICATE OF CORRECTION

PATENT NO. : 5,278,552
DATED : January 11, 1994
INVENTOR(S) : Ito

It is certified that error appears in the above-identified patent and that said Letters Patent is hereby corrected as shown below:

CLAIM 1, col. 7, line 45, delete $(2^n-1)2^n$ and substitute therefor ---$(2^n-1)2^n$; CLAIM 1, col. 7, line 57, delete ½" and substitute therefor ---$1/2^n$---; CLAIM 1, col. 7, line 68 through col. 8, line 3, delete "in a case...of said second digital data,"; CLAIM 1, col. 8, line 48, after the word "number" insert ---of---

Signed and Sealed this

Thirtieth Day of August, 1994

Attest:

BRUCE LEHMAN

Attesting Officer

Commissioner of Patents and Trademarks